(12) United States Patent
Lower et al.

(10) Patent No.: US 11,373,976 B2
(45) Date of Patent: Jun. 28, 2022

(54) SYSTEM AND METHOD FOR EXTREME PERFORMANCE DIE ATTACH (71) Applicant: Rockwell Collins, Inc., Cedar Rapids, IA (US)

(72) Inventors: Nathan P. Lower, North Liberty, IA (US); Haley M. Steffen, Cedar Rapids, IA (US); Ross K. Wilcoxon, Cedar Rapids, IA (US); David L. Westergren, Marion, IA (US); Brian K. Otis, Solon, IA (US); Pete Sahayda, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 233 days.

(21) Appl. No.: 16/530,016

(22) Filed: Aug. 2, 2019

(65) Prior Publication Data
US 2021/0202433 A1 Jul. 1, 2021

(51) Int. Cl.
B32B 38/10 (2006.01)
H01L 21/683 (2006.01)
H01L 23/00 (2006.01)

(52) U.S. Cl.
CPC .......... H01L 24/81 (2013.01); H01L 21/6838 (2013.01); H01L 24/11 (2013.01); H01L 24/13 (2013.01); H01L 2224/1111 (2013.01); H01L 2224/11505 (2013.01); H01L 2224/13139 (2013.01); H01L 2224/8184 (2013.01)

(58) Field of Classification Search
CPC ... H01L 2224/29339; H01L 2224/8384; H01L 2224/05639; H01L 24/83; H01L 24/05; H01L 2224/27436
See application file for complete search history.

(56) References Cited

U.S. PATENT DOCUMENTS

| 4,856,185 A * | 8/1989 | Baumgartner ......... H01L 24/83 29/840 |
| 7,830,021 B1 | 11/2010 | Wilcoxon et al. |
| 10,096,508 B2 * | 10/2018 | Paramio Joves ... H01L 21/6838 |
| 2005/0014312 A1 * | 1/2005 | Brandenburg ...... H01L 23/3736 438/122 |
| 2009/0229975 A1 * | 9/2009 | Yamakoshi ........... C04B 37/026 204/298.13 |
| 2013/0328204 A1 * | 12/2013 | Zommer ................. H01L 24/03 257/765 |
| 2015/0146399 A1 * | 5/2015 | Viswanathan ..... B23K 35/0244 361/785 |

(Continued)

Primary Examiner — Phat X Cao
Assistant Examiner — David J Goodwin
(74) Attorney, Agent, or Firm — Suiter Swantz pc llo (57) ABSTRACT A method for fabricating semiconductor die with die-attach preforms is disclosed. In embodiments, the method includes: applying an uncured die-attach paste material to a surface of a forming substrate to form one or more die-attach preforms, the surface of the forming substrate formed from a hydrophobic material; curing the one or more die-attach preforms; performing one or more planarization processes on the one or more die-attach preforms; coupling a first surface of a semiconductor die to a handling tool; and bonding a second surface of the semiconductor die to at least one die-attach preform of the one or more die-attach preforms.

10 Claims, 8 Drawing Sheets (56) References Cited

U.S. PATENT DOCUMENTS

2016/0049325 A1* 2/2016 Paramio Joves ............................ H01L 21/67132
　　　　　　　　　　　　　　　　　　　　　　　　　　156/247
2020/0294961 A1* 9/2020 Mita ....................... H01L 24/27

* cited by examiner

SYSTEM AND METHOD FOR EXTREME PERFORMANCE DIE ATTACH

BACKGROUND

Semiconductor die-attach materials play a significant role in the reliability and thermal resistance of bonded semiconductor die used in chips and integrated circuits. Sintered silver materials have become increasingly popular die-attach materials for high-power device applications, as well as in contexts which require extremely low thermal resistance interfaces between the semiconductor die and the associated substrate. For example, sintered nano-silver films have been found to exhibit low thermal resistance and excellent adhesion.

In order to bond semiconductor die to the die-attach materials, die-attach materials are typically formed into large die-attach films. The die-attach films may be formed on top of a polymer release film, which may then be deposed on a compliant material (e.g., rubber sheet). Subsequently, the semiconductor die are pressed against the film such that the die-attach film is lightly bonded, or "tacked," to the bottom surface of the semiconductor die. The rubber sheet may then cause the die-attach film to deform around the edges of the semiconductor die such that the edges of the semiconductor die cut the film into the shape of the semiconductor die, and the portion of the die-attach film tacked to the bottom surface of the semiconductor die is separated from the larger die-attach film. The die-attach film may be bonded to the semiconductor die using heat and pressure. When the semiconductor die is then removed from the film, the portion of the film disposed beneath the semiconductor die may adhere to the bottom surface of the semiconductor die. Subsequently, the semiconductor die including the layer of die-attach material may be coupled to a product substrate (e.g., printed circuit board (PCB), ceramic substrate, integrated circuit device, multi-chip module, and the like) by sintering the die-attach material layer.

This traditional method of coupling die-attach materials to semiconductor die suffers from multiple drawbacks. First, this traditional approach is typically only feasible with larger semiconductor die (e.g., die larger than 0.05"×0.05"). With smaller die, the force required to locally cut the film such that the film may adhere to the die and separate from the film sheet is large enough to damage the small die. Secondly, using the die edges to cut the die-attach often is not an efficient and/or reliable process. With die of all sizes, the edges of the die may not cut the die-attach film cleanly during transfer. Furthermore, many semiconductor die include non-planar circuitry and other structures on a surface of the die which may be damaged when force is applied to the top surface of the die during the die-attach transfer processes.

Therefore, there exists a need in the art for a system and method which address one or more of the shortfalls of previous approaches identified above.

SUMMARY

A method for fabricating semiconductor die with die-attach preforms is disclosed. In embodiments, the method includes: applying an uncured die-attach paste material to a surface of a forming substrate to form one or more die-attach preforms, the surface of the forming substrate formed from a hydrophobic material; curing the one or more die-attach preforms; performing one or more planarization processes on the one or more die-attach preforms; coupling a first surface of a semiconductor die to a handling tool; and bonding a second surface of the semiconductor die to at least one die-attach preform of the one or more die-attach preforms.

A method for fabricating semiconductor die with die-attach preforms is disclosed. In embodiments, the method includes: forming one or more die-attach preforms on a forming substrate; performing one or more planarization processes on the one or more die-attach preforms; forming a graphite pad on a surface of a handling tool; coupling the graphite pad to a first surface of a semiconductor die; and bonding a second surface of the semiconductor die to at least one die-attach preform of the one or more die-attach preforms, wherein the at least one die-attach preform substantially conforms to a shape and size of the second surface of the semiconductor die.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are provided for example only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

In order to bond semiconductor die to the die-attach materials, die-attach materials are typically formed into large die-attach films. The die-attach films may be formed on top of a polymer release film, which may then be deposed on a compliant material (e.g., rubber sheet). Subsequently, the semiconductor die are pressed against the film such that the die-attach film is lightly bonded, or "tacked," to the bottom surface of the semiconductor die. The rubber sheet may then cause the die-attach film to deform around the edges of the semiconductor die such that the edges of the semiconductor die cut the film into the shape of the semiconductor die, and the portion of the die-attach film tacked to the bottom surface of the semiconductor die is separated from the larger die-attach film. The die-attach film may be bonded to the semiconductor die using heat and pressure. When the semiconductor die is then removed from the film, the portion of the film disposed beneath the semiconductor die may adhere to the bottom surface of the semiconductor die. Subsequently, the semiconductor die including the layer of die-attach material may be coupled to a product substrate (e.g., printed circuit board (PCB), ceramic substrate, integrated circuit device, multi-chip module, and the like) by sintering the die-attach material layer.

This traditional method of coupling die-attach materials to semiconductor die suffers from multiple drawbacks. First, this traditional approach is typically only feasible with larger semiconductor die. With smaller die, the force required to locally cut the film such that the film may adhere to the die and separate from the film sheet is large enough to damage the small die. Secondly, using the die edges to cut the die-attach often is not an efficient and/or reliable process. With dies of all sizes, the edges of the die may not cut the die-attach film cleanly during transfer. Furthermore, many semiconductor die include non-planar circuitry and other structures on a surface of the die which may be damaged when force is applied to the surface of the die with those structures during the die-attach transfer processes.

Accordingly, embodiments of the present disclosure are directed to a system and method which address one or more of the shortfalls of previous approaches identified above. Embodiments of the present disclosure are directed to a method for fabricating semiconductor die with die-attach preforms. In particular, embodiments of the present disclosure are directed to a method for attaching assemblies of semiconductor die with sintered silver preforms. Additional embodiments of the present disclosure are directed to a method of fabricating semiconductor die with die-attach preforms using a handling tool including a graphite pad. Further embodiments of the present disclosure are directed to a system for fabricating semiconductor die with die-attach preforms using a handling tool.

It is contemplated herein that embodiments of the present disclosure may provide for an improved system and method for fabricating semiconductor die, chips, modules, and other devices with improved thermal and radio frequency (RF) performance. The improved system and method of the present disclosure may enable high-density chip co-location, improved semiconductor die fabrication, extreme miniaturization of semiconductor die and chips, as well as improved power and thermal characteristics.

Figure 1:
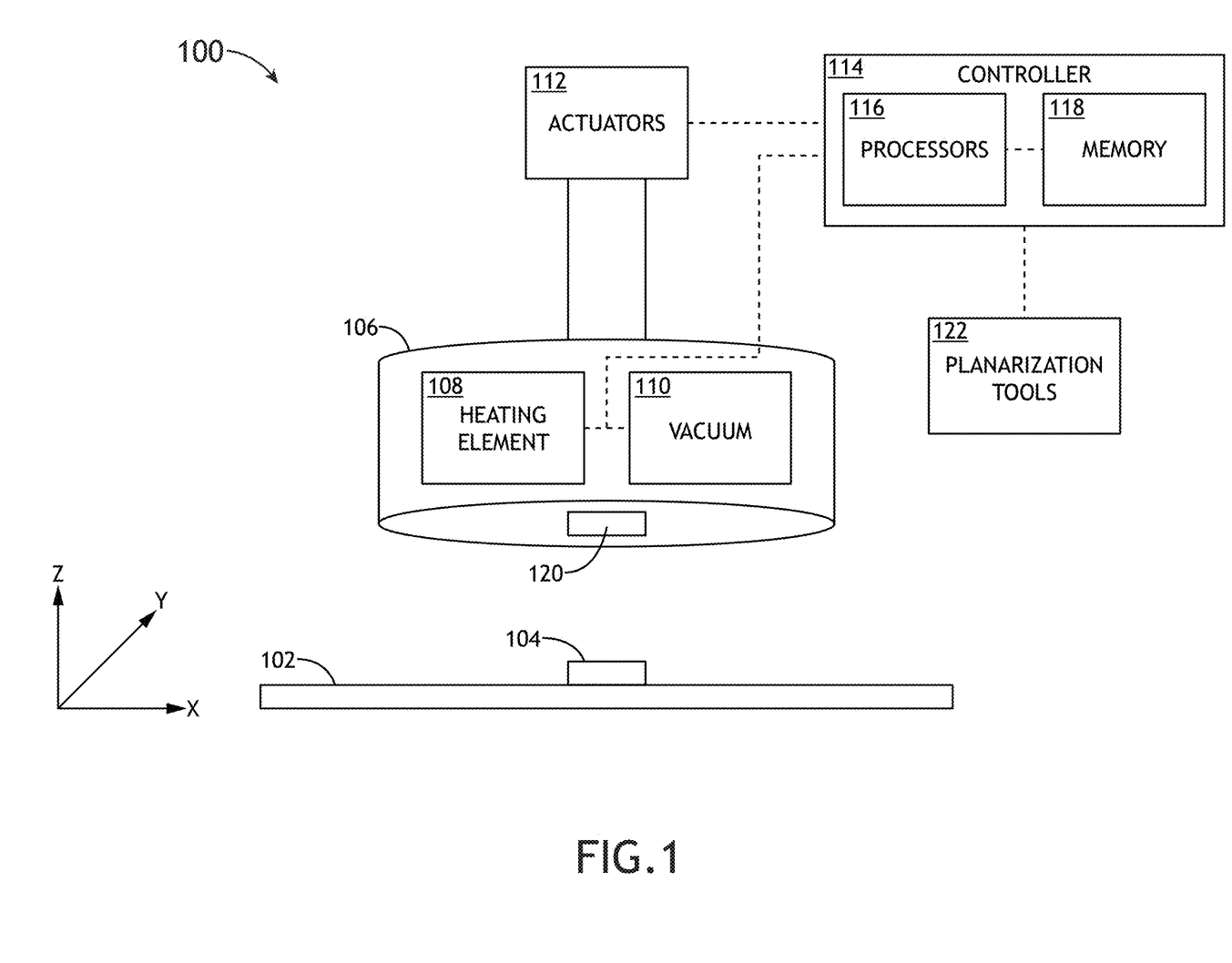
FIG. 1 illustrates a simplified block diagram view of a system for attaching semiconductor die to a die-attach preform, in accordance with one or more embodiments of the present disclosure.

FIG. 1 illustrates a simplified block diagram view of a system 100 for attaching semiconductor die to a die-attach preform, in accordance with one or more embodiments of the present disclosure. The system 100 may include, but is not limited to, a forming substrate 102, a handling tool 106, one or more actuators 112, a controller 114 including one or more processors 116 and a memory 118. In another embodiment, the system 100 may include and one or more planarization tools 122 communicatively coupled to the controller 114.

In embodiments, one or more die-attach preforms 104 may be formed on the forming substrate 102. It is noted herein that the one or more die-attach preforms 104 may be formed with any material known in the art including, but not limited to, sintered silver. In this regard, the one or more die-attach preforms 104 may be referred to as sintered silver preforms 104. However, this is not to be regarded as a limitation of the present disclosure, unless noted otherwise herein.

The handling tool 106 may be communicatively coupled to one or more actuators 112 and/or the controller 114. For example, the handling tool 106 may include one or more heating elements 108 and one or more vacuum sources 110 communicatively coupled to the controller 114.

In other embodiments, the controller 114 may include one or more processors 116 and a memory 118, wherein the one or more processors 116 are configured to execute a set of program instructions stored in memory 118, the set of program instructions configured to cause the one or more processors 116 to carry out various steps/functions of the present disclosure. For example, the one or more processors 116 may be configured to: generate one or more control signals configured to cause the one or more planarization tools 122 to perform one or more planarization processes on the sintered silver preforms 104; generate one or more control signals configured to cause the one or more actuators 112 to actuate the handling tool 106 to couple the handling tool 106 to one or more semiconductor die 120; generate one or more control signals configured to cause the one or more vacuum sources 110 to create a suction force to handle the one or more semiconductor dies 120; generate one or more control signals configured to actuate the handling tool 106 in order to bond the semiconductor die 120 to one or more sintered silver preforms 104; generate one or more control signals configured to cause the one or more heating elements 108 to generate heat to cure the sintered silver preforms 104; and generate one or more control signals configured to cause the one or more actuators 112 to actuate the semiconductor die 120 including a sintered silver preform 104 in order to couple the semiconductor die 120 to a product substrate (not shown).

Figure 2A:
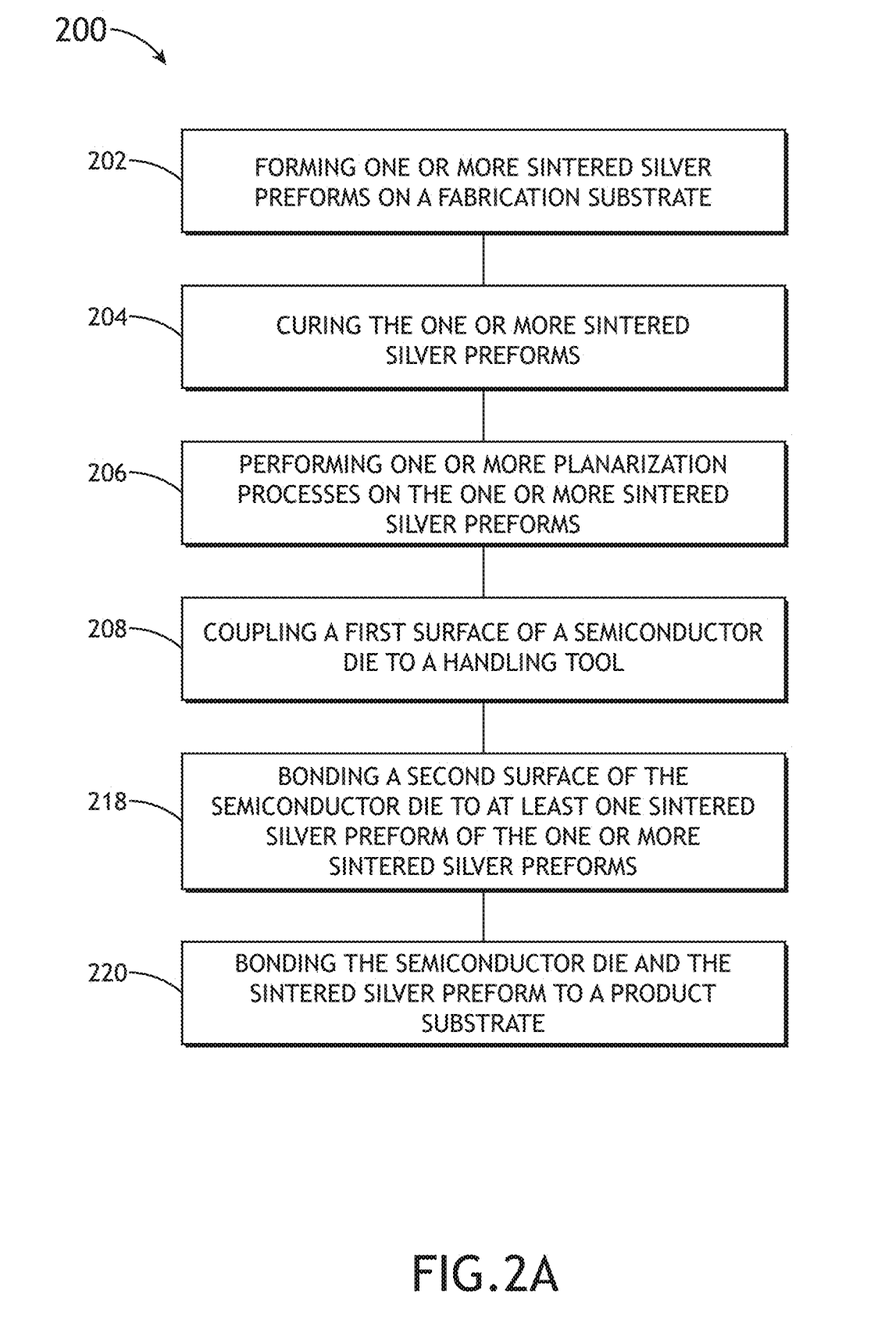
FIG. 2A illustrates a flowchart of a portion of a method for attaching semiconductor die to a die-attach preform, in accordance with one or more embodiments of the present disclosure.
Figure 2B:
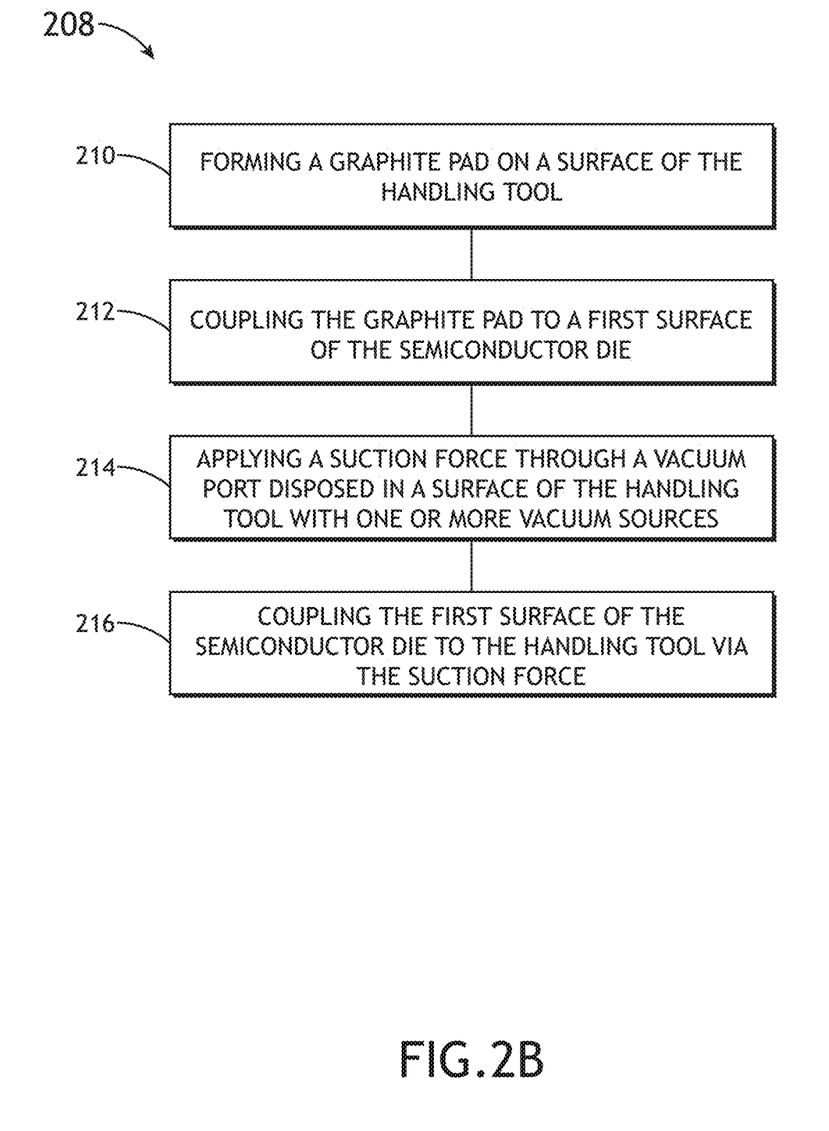
FIG. 2B illustrates a flowchart of a portion of a method for fabricating semiconductor die with a die-attach preform, in accordance with one or more embodiments of the present disclosure.

Each of the processes/functions carried out by the controller 114 and other components of system 100 may be further understood with reference to FIG. 2.

FIG. 2A illustrates a flowchart of a portion of a method 200 for attaching semiconductor die 120 to a die-attach preform 104, in accordance with one or more embodiments of the present disclosure.

In a step 202, one or more die-attach preforms 104 (e.g., sintered silver preforms 104) are formed on a forming substrate 102. As noted previously herein, the die-attach material used to form the one or more die-attach preforms 104 may include any die-attach material known in the art including, but not limited to, sintered silver, gold-tin eutectic materials, and the like.

The one or more die-attach preforms 104 may be fabricated, printed, or otherwise formed using any technique known in the art. In embodiments, the one or more die-attach preforms 104 may be formed by applying uncured (e.g., wet) die-attach material paste (e.g., sintered silver paste material) to the forming substrate 102. For example, a stencil may be disposed on a surface of the forming substrate 102, and a wet sintered silver paste material may be applied over the stencil and forming substrate 102. Subsequently, the stencil may be removed from the forming substrate 102. Upon removal of the stencil, excess sintered silver paste material may be removed, and the one or more sintered silver preforms 104 may be formed. It is noted herein that the stencil used to facilitate die-attach preform 104 printing may exhibit varying shapes, sizes, and configurations.

The forming substrate 102 may be formed from any material known in the art including, but not limited to, ceramic materials, alumina, and the like. It is contemplated herein that the use of a mechanically hard material, such as alumina, may reduce edge rounding in subsequent steps of method 200 when the semiconductor die 120 is coupled to the die-attach preforms 104. In embodiments, the forming substrate 102 may be configured and/or be formed from materials which facilitate removal/release of the die-attach preforms 104 from the forming substrate 102. For example, the forming substrate 102 may be formed from and/or coated with a hydrophobic material in order to provide a non-stick surface to prevent the uncured (e.g., wet) die-attach material (e.g., sintered silver) from adhering to the forming substrate 102. For instance, the forming substrate 102 may be coated with a Teflon coating or other fluoropolymer coating. The hydrophobic coating used to provide a non-stick surface of the forming substrate 102 may be 1-2 µm thick. It is further noted herein that the use of a non-stick surface may provide a large contact angle on the forming substrate 102 in order to prevent the uncured (e.g., wet) die attach material from wetting underneath a stencil and/or flowing outside the borders of cut-outs within the stencil.

It is contemplated herein that the one or more die-attach preforms 104 may be formed in any configuration or array known in the art. This may be further understood with reference to FIG. 3.

Figure 3:
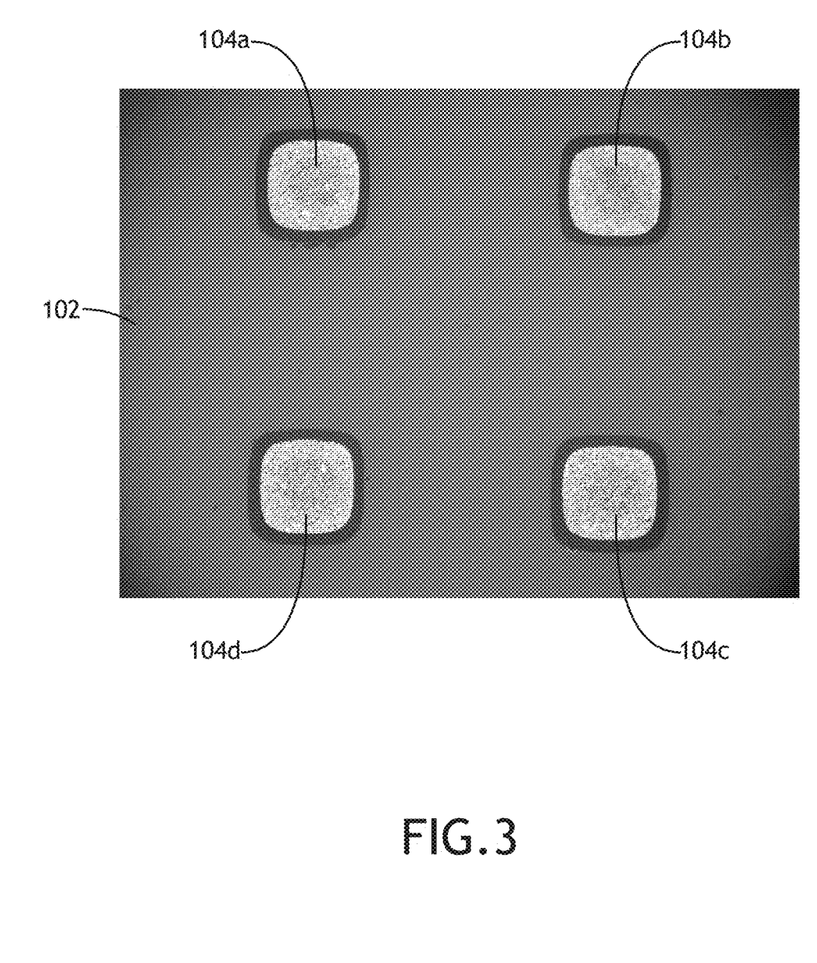
FIG. 3 illustrates a top view of sintered silver preforms, in accordance with one or more embodiments of the present disclosure.

FIG. 3 illustrates a top view of sintered silver preforms 104a, 104b, 104c, 104d, in accordance with one or more embodiments of the present disclosure.

As shown in FIG. 3, the one or more die-attach preforms 104 (e.g., sintered silver preforms 104) may be formed on the forming substrate 102 in a 2×2 array. For example, a stencil including cut-outs for a 2×2 array of preforms may be disposed on the forming substrate 102, applied with a wet sintered silver paste material, and subsequently removed to form the 2×2 array of sintered silver preforms 104a, 104b, 104c, 104d. In embodiments, the one or more sintered silver preforms 104 may be formed/fabricated for a particular shape and size of semiconductor die 120. For example, the one or more sintered silver preforms 104 may be formed/fabricated such that they substantially conform to a shape and/or size of a selected semiconductor die 120. Accordingly, in embodiments including a stencil used to form the sintered silver preforms 104, the stencil may include cut-outs which substantially conform to the shape and size of a selected semiconductor die 120.

In addition to enabling more efficient and reliable fabrication of semiconductor die 120 with die-attach layers, it has also been found that embodiments of the present disclosure may provide significant cost savings throughout the fabrication processes. Due to the fact that the die-attach preforms 104 may be tailored to conform to specific sizes and shapes of specified semiconductor die 120, less die-attach material may be wasted, thereby decreasing the quantity of die-attach material required for a specified number of semiconductor dies 120. For example, it has been found that sintered silver preforms 104 may be formed at a cost of approximately $0.0005 per preform 104/semiconductor die 120, significantly less than is feasible using traditional die-attach film approaches.

Reference will again be made to FIG. 2A. In a step 204, the one or more die-attach preforms 104 (e.g., sintered silver preforms 104) are cured (e.g., dried). Curing the die-attach preforms 104 may include heating and/or drying in order to form a solid, weakly-bonded material. For example, the controller 114 may be configured to generate one or more control signals configured to cause the heating elements 108 and/or heating elements external to the handling tool 106 (not shown) to generate heat in order to dry the sintered silver preforms 104. It is noted herein that the duration and/or temperature of the curing/drying process may be dependent upon the material used to form the die-attach preforms 104. For example, the die-attach preforms 104 may be cured at (e.g., dried) a temperature between 120-160° C. below the sintering temperature associated with the die-attach material. For example, sintered silver preforms 104 may exhibit a sintering temperature between 250-290° C. In this regard, the sintered silver preforms 104 may be cured at a temperature of approximately 120-170° C. For instance, the sintered silver preforms 104 may be cured at a temperature of approximately 130° C.

In a step 206, one or more planarization processes are performed on the one or more die-attach preforms 104 (e.g., sintered silver preforms 104). It is noted herein that, following curing in step 204, the die-attach preforms 104 may typically exhibit a non-uniform thickness. This may be further understood with reference to FIG. 4.

Figure 4:
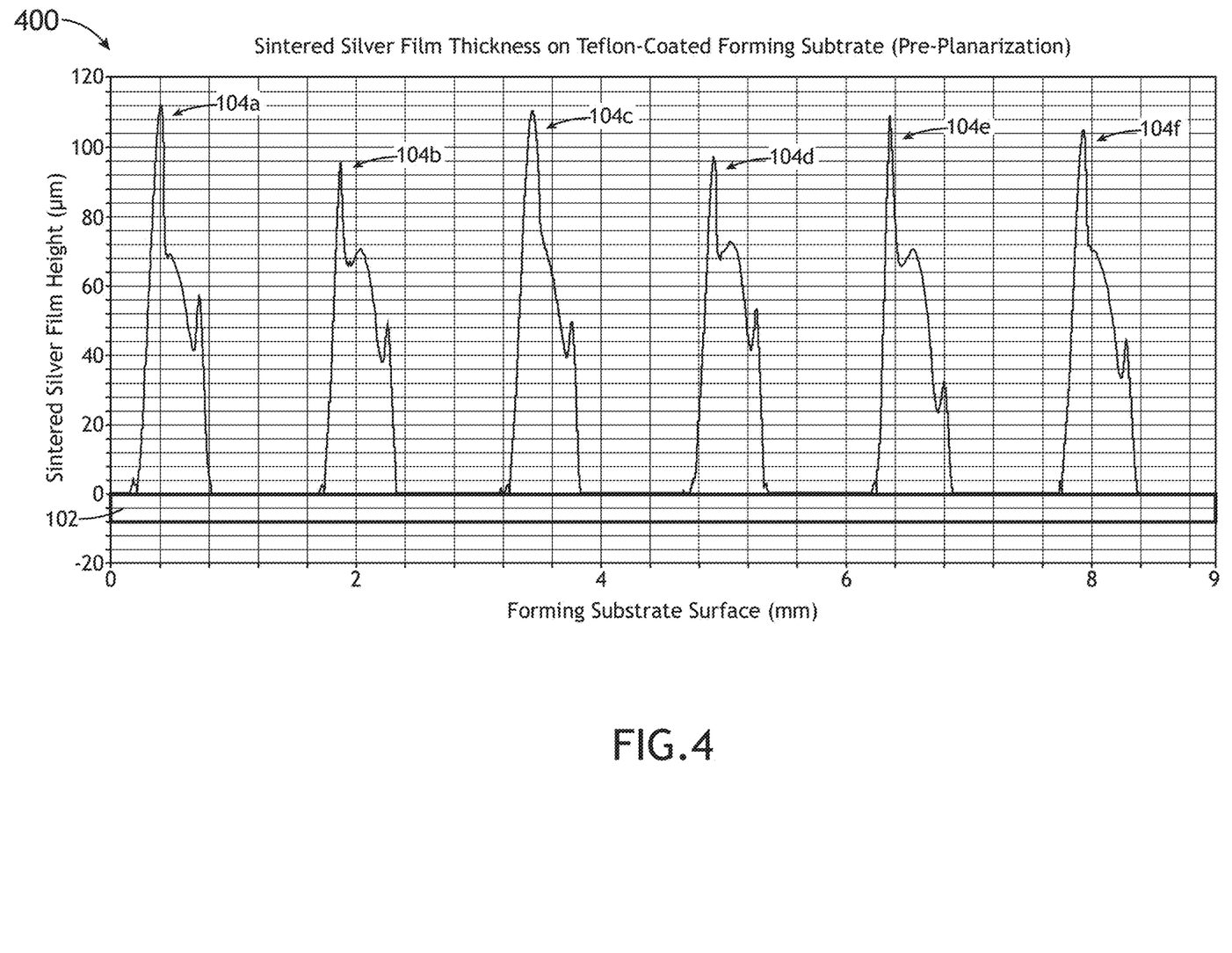
FIG. 4 illustrates a graph depicting thicknesses of sintered silver preforms on a Teflon-coated forming substrate prior to planarization, in accordance with one or more embodiments of the present disclosure.

FIG. 4 illustrates a graph 400 depicting thicknesses of sintered silver preforms 104a-104f on a Teflon-coated forming substrate 102 prior to planarization, in accordance with one or more embodiments of the present disclosure. In particular, graph 400 illustrates the non-uniform thicknesses of a plurality of sintered silver preforms 104a-104f fabricated on a Teflon-coated forming substrate 102. It is further noted herein, however, that graph 400 may also be understood to illustrate thicknesses of sintered silver preforms 104a-104f on alternative and/or additional substrate surfaces configured to inhibit adhesion to the substrate 102.

As may be seen in graph 400, each individual sintered silver preform 104a-104f may exhibit substantial thickness fluctuations across the upper surface of the sintered silver preform 104a-104f. Absent any planarization processes configured to level and flatten the surfaces of the sintered silver preforms 104a-104f, the sintered silver preforms 104a-104f would not be flush and/or conform to the surface of a semiconductor die 120, and would therefore may not form an adequate bond with the semiconductor die 120.

In this regard, one or more planarization processes may be performed in step 206 in order to planarize the one or more die-attach preforms 104 (e.g., sintered silver preforms 104a-104f). The planarization processes may be configured to remove material from the die-attach preforms 104 (e.g., sintered silver preforms 104a-104f) in order to generate die-attach preforms 104 of substantially uniform thicknesses. For example, the controller 114 may be configured to generate one or more control signals configured to cause the one or more planarization tools 122 to perform one or more planarization processes on the die-attach preforms 104 disposed on the forming substrate 102. The planarization tools 122 may include any planarization/machining tools known in the art including, but not limited to, precision lathes, precision mills, diamond turning machining tools, and the like.

Figure 5:
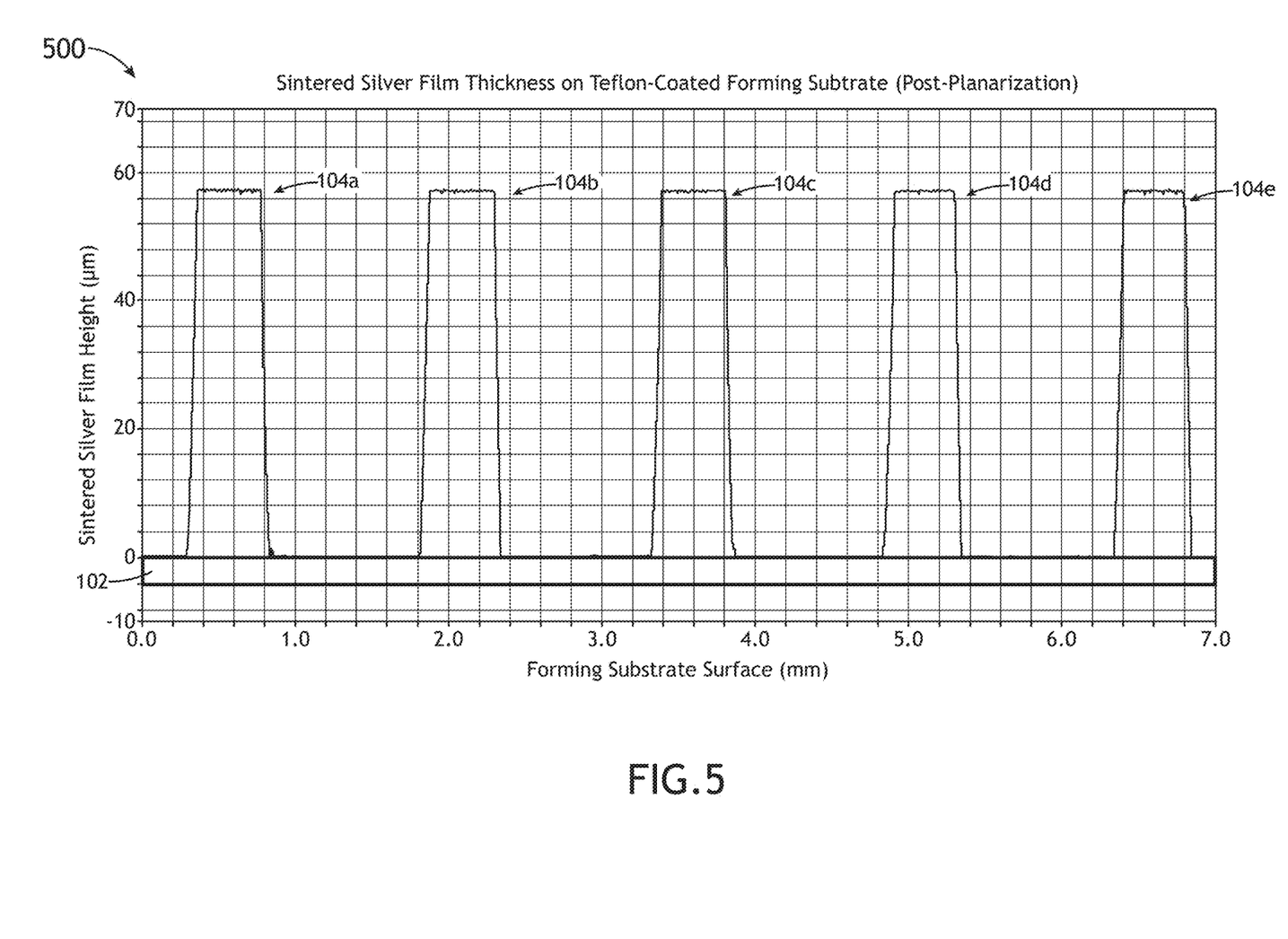
FIG. 5 illustrates a graph depicting thicknesses of sintered silver preforms on a Teflon-coated forming substrate following planarization, in accordance with one or more embodiments of the present disclosure.

FIG. 5 illustrates a graph 500 depicting thicknesses of sintered silver preforms 104a-104e on a Teflon-coated forming substrate 102 following planarization, in accordance with one or more embodiments of the present disclosure. As may be seen in graph 500, the sintered silver preforms 104a-104f may exhibit substantially improved thickness uniformity following planarization, which may enable effective coupling to the semiconductor die 120 in subsequent steps. It is further noted herein, however, that graph 500 may also be understood to illustrate thicknesses of sintered silver preforms 104a-104e on alternative and/or additional substrate surfaces configured to inhibit adhesion to the substrate 102.

Reference will again be made to FIG. 2A. In a step 208, a first surface of a semiconductor die 120 is coupled to a handling tool 106. For example, as shown in FIG. 1, an upper surface of the semiconductor die 120 may be coupled to a lower surface of the handling tool 106 such that the handling tool 106 may be actuated and control the motion of the semiconductor die 120.

It is contemplated herein that the semiconductor die 120 may be held and/or coupled to the handling tool 106 using any technique known in the art. For example, the semiconductor substrate 120 may be coupled to the handling tool 106 through the use of a graphite pad, vacuum suction, and the like. This may be further understood with reference to FIG. 2B.

FIG. 2B illustrates a flowchart of a portion of method 200 for fabricating semiconductor die 120 with a die-attach preform, in accordance with one or more embodiments of the present disclosure. In particular, FIG. 2B illustrates potential sub-steps of step 208 for coupling a semiconductor die 120 to a handling tool 120. As noted previously herein, the semiconductor die 120 may be held and/or coupled to the handling tool 106 using any technique known in the art. In this regard, the steps illustrated in FIG. 2B are provided as examples and are not to be regarded as a limitation of the present disclosure, unless noted otherwise herein.

In a step 210, a graphite pad is formed on a surface of the handling tool 106. The handling tool 106 may include any actuatable tool known in the art configured to receive and handle semiconductor materials including, but not limited to, a robot, an actuatable mechanical arm, and the like. This may be further shown and described with reference to FIGS. 6A-6B.

Figure 6A:
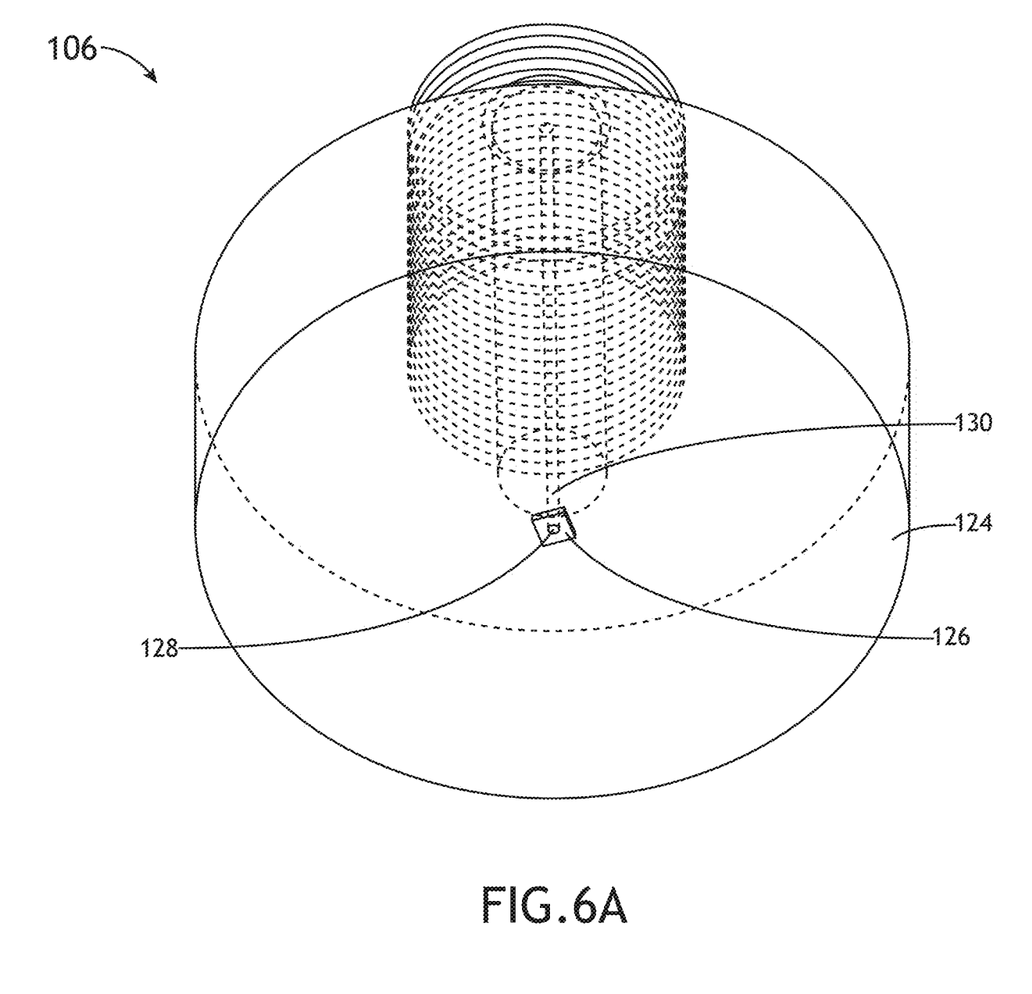
FIG. 6A illustrates a bottom perspective view of a handling tool, in accordance with one or more embodiments of the present disclosure.
Figure 6B:
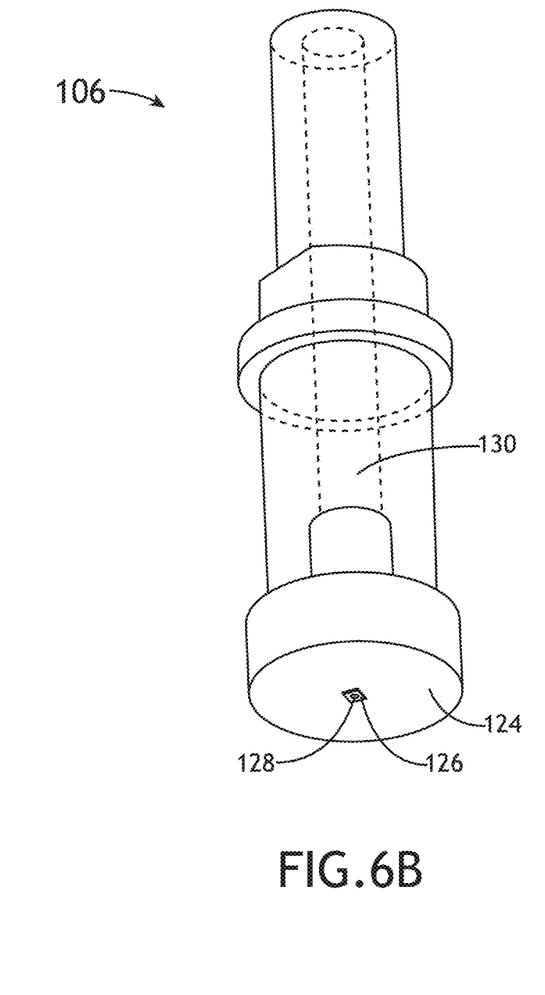
FIG. 6B illustrates a side perspective view of a handling tool, in accordance with one or more embodiments of the present disclosure.

FIG. 6A illustrates a bottom perspective view of a handling tool 106, in accordance with one or more embodiments of the present disclosure. FIG. 6B illustrates a side perspective view of a handling tool 106, in accordance with one or more embodiments of the present disclosure.

In embodiments, a graphite pad 126 may be formed on a surface 124 of the handling tool 106. For example, a graphite pad 126 may be formed on a lower surface 124 of the handling tool 106. The surface 124 of the handling tool 106 may be formed from any material known in the art including, but not limited to, copper materials. Additionally, as noted previously herein with respect to the forming substrate 102, the surface 124 of the handling tool 106 configured to be coupled to the graphite pad 126/semiconductor die 120 may be coated with a non-stick, hydrophobic coating (e.g., fluoropolymer coating, Teflon). Hydrophobic coatings on the surface 124 of the handling tool 106 may enable easier removal of the graphite pad 126 and/or semiconductor substrates 120 in subsequent steps.

The graphite pad 126 may include any graphite pad known in the art including, but not limited to, a pyrolytic graphite film. In embodiments, a graphite pad 126 may be fabricated by applying a metal material to a graphite sheet. For example, after cleaning a graphite sheet (e.g., pyrolytic graphite sheet), the graphite sheet may be sputtered with an adhesion metal (e.g., titanium (Ti), chromium (Cr), nickel-chromium (NiCr)) followed by a seed metal(s) (e.g., palladium (Pd), copper (Cu)) and a low-melting temperature metal (e.g., tin (Sn), indium (In)). The various materials may be applied to the graphite sheet using any technique known in the art including, but not limited to, electroplating, electroless or immersion plating, sputtering, and the like. In embodiments, graphite pad 126 may be sized such that it substantially conforms to a shape and/or size of a selected semiconductor die 120. Any methods known in the art may be used to cut or otherwise shape the graphite pad 126 including, but not limited to, steel rule die, razor blades, lasers, roll die, and the like.

In embodiments, the graphite pad 126 may be subsequently coupled to the surface 124 of the handling tool 106. In some embodiments, the graphite pad 126 may be coupled to the surface 124 of the handling tool 106 using one or more diffusion bonding processes. For example, the graphite pad 126 may be coupled to the surface 124 of the handling tool 106 using transient liquid phase bonding, diffusion bonding, brazing processes, or the like.

For instance, in order to carry out transient liquid phase bonding, the controller 114 may actuate the handling tool 106 via actuators 112 in order to bring the handling tool 106 and the graphite pad 126 into contact. Subsequently, the controller 114 may cause the one or more heating elements 108 to generate heat and may actuate the handling tool 106 in order to induce heat and pressure between the surface 124 and the graphite pad 126. While using tin as a metallizing material for the graphite pad 126, the temperature for transient liquid phase bonding should be within the range of approximately 250° C. and 350° C. Additionally, the bonding time required for transient liquid phase bonding may be dependent upon the materials used in forming the graphite pad 126. A forming gas may be used during bonding in order to minimize oxidation of the copper surface 124 of the handling tool 106 and tin material within the graphite pad 126. The resulting bond between the graphite pad 126 and surface 124 of the handling tool 106 will be a high-melting point alloy/metallurgical bond with a melting point within the range of approximately 450° C. and 550° C. It is noted herein that the creation of a high-melting point alloy to bond the graphite pad 126 to the handling tool 106 is important to ensure sintering temperatures of the die-attach preforms 104 may be achieved without breaking the bond between the graphite pad 126 to the handling tool 106. Transient liquid phase bonding is described in further detail in U.S. Pat. No. 7,830,021 B1, filed on Sep. 6, 2005, naming Ross K. Wilcoxon, Alan P. Boone, and James R. Wooldridge as inventors which is incorporated herein by reference in the entirety.

In a step 212, the graphite pad 126 is coupled to a first surface of the semiconductor die 120. For example, the controller 114 may be configured to generate one or more control signals configured to cause the actuators 112 to actuate the handling tool 106 in order to bring the surface 124 and/or graphite pad 126 into contact with an upper surface of a semiconductor die 120.

It is noted herein that the graphite pad 126 may provide a soft but compliant surface which may prevent damage (e.g., scratching, cracking, passivation) to the semiconductor die 120. In particular, the compliancy of the graphite pad 126 may help to evenly distribute pressure and bonding forces across the upper surface of the semiconductor die 120, which may reduce stress across the semiconductor die 120 and prevent damage to delicate chip features on the upper surface of the semiconductor die 120 (e.g., air bridges, PIN diodes, monolithic microwave integrated circuits (MMICs)). It is noted herein that the graphite pad 126 may provide an efficient pick tool surface for a wide range of semiconductor die 120 sizes.

Additionally, the graphite pad 126 may be configured to handle very high temperature bonding (e.g., greater than 500° C.) and improve heat transfer to/through the semiconductor die 120 from the one or more heating elements 108, which is necessary for high-speed bonding processes throughout subsequent steps of method 200. Furthermore, as a good high-temperature elastomer, the graphite pad 126 may be extremely resilient and capable of being heated and/or compressed many times without degrading. Accordingly, it is contemplated herein that the graphite pad 126 may be used to handle many semiconductor die 120 throughout a fabrication process. Subsequently, when the graphite pad 126 is to be removed, it has been found that the graphite pad 126 may be easily removed from the surface 124 of the handling tool 106 via polishing processes.

In embodiments, the graphite pad 126 may include one or more carve-outs configured to receive one or more structures disposed on the first surface (e.g., upper surface) of the semiconductor die 120. For example, the semiconductor die 120 may include any number of structures and/or features on the upper surface of the semiconductor die 120 (e.g., air bridges, PIN diodes, monolithic microwave integrated circuits (MMICs)). In order to reduce and/or prevent pressure from being applied to these structures, and potentially damaging the structures, one or more carve-outs may be formed in the bottom surface of the graphite pad 126. The one or more carve-outs may be formed using any technique known in the art including, but not limited to, steel rule die, razor blades, lasers, roll die, and the like. Accordingly, the one or more carve-outs on the lower surface of the graphite pad 126 may be configured to receive the one or more structures on the upper surface of the semiconductor die 120 in order to reduce and/or prevent pressure on the one or more structures.

In a step 214, a suction force is applied through a vacuum port 128 disposed in the surface 124 of the handling tool 106 with the one or more vacuum sources 110. For example, the controller 114 may generate one or more control signals configured to cause the one or more vacuum sources 110 to generate a suction force through a vacuum port 128 disposed in the surface 124 of the handling tool 106. In this regard, the one or more vacuum sources 110 may be fluidically coupled to the vacuum port 128 via one or more lines 130. One or more vacuum ports 128 may be distributed throughout the surface 124 of the handling tool 106. The vacuum ports 128 may take on any shape or size. For example, the one or more vacuum ports 128 may include circular ports with 3 mm diameters.

It is noted herein that suction forces may be used to temporarily couple a semiconductor die 120 to the handling tool 106. The suction forces may be used in addition to, or in lieu of, the graphite pad 126 to enable efficient and reliable handling. In embodiments where the handling tool 106 utilizes both a graphite pad 126 and suction forces to handle a semiconductor die 120, the suction forces may be applied through both the vacuum port 128 and the graphite pad 126. For example, a graphite pad 126 may be formed on the surface 124 of the handling tool 106 such that the graphite pad 126 completely or partially covers the one or more vacuum ports 128. A drill or other means may then be used to remove the portions of the graphite pad 126 covering the one or more vacuum ports 128 in order to create one or more apertures within the graphite pad 126. The one or more vacuum sources 110 may then apply a suction force through the one or more vacuum ports 128 and the one or more apertures within the graphite pad 126.

In a step 216, the first surface of the semiconductor die 120 is coupled to the handling tool 106 and/or graphite pad 126 via the suction force. For example, in embodiments without a graphite pad 126, a suction force may be applied through the one or more vacuum ports 128 in order to couple the surface 124 of the handling tool 106 directly to the upper surface of the semiconductor die 120. By way of another example, in embodiments with a graphite pad 126, a suction force may be applied through the one or more vacuum ports 128 and the one or more apertures within the graphite pad 126 in order to couple a surface of the graphite pad 126 to the upper surface of the semiconductor die 120.

Reference will again be made to FIG. 2A. In a step 218, a second surface of the semiconductor die 120 is bonded to at least one die-attach preform 104 (e.g., sintered silver preform 104). For example, the controller 114 may generate one or more control signals configured to cause the actuators 112 to actuate the handling tool 106 in order to bring the lower surface of the semiconductor die 120 into contact with an upper surface of a sintered silver preform 104. In this regard, the handling tool 106 may apply a first pressure between the graphite pad 126 and the upper surface of the semiconductor die 120, and a second pressure between the lower surface of the semiconductor die 120 and the upper surface of a sintered silver preform 104.

In a step 220, the semiconductor die 120 including a bonded sintered silver preform 104 is bonded to a product substrate. For example, the semiconductor die 120 including a sintered silver preform 104 bonded to the second surface of the semiconductor die 120 may be bonded to a product substrate 120 (e.g., printed circuit board (PCB), ceramic substrate, integrated circuit device, multi-chip module, and the like) using heat and pressure.

Using conventional techniques for coupling semiconductor die to die-attach films, large forces/pressures were required to be applied to the semiconductor die in order to cut the die-attach films. Conversely, due to the fact that the die-attach preforms 104 are already cut and sized, the forces required to couple the semiconductor die 120 to the die-attach preforms 104 may be significantly reduced, thereby preventing damage (e.g., scratching, cracking, passivation) to the semiconductor die 120. These reduced forces are especially important in the context of semiconductor die 120 with delicate structures (e.g., air bridges, PIN diodes, monolithic microwave integrated circuits (MMICs)) which are susceptible to damage under stress. Furthermore, it is noted herein that the area of small die is not linearly proportional to the perimeter. In this regard, conventional methods for cutting die-attach films require exceedingly high forces to achieve effective cutting of the die-attach films, which may damage the small semiconductor die 120. Accordingly, the reduced forces enabled by the present disclosure may prove to be extremely valuable in the context of enabling semiconductor die 120 of decreasing sizes.

It is noted herein that bonding with die-attach materials often requires pressure and heat. Accordingly, in some embodiments, the controller 114 may generate one or more control signals configured to cause the one or more heating elements 108 to generate heat such that heat may be applied through the surface 124 of the handling tool 106 and through the graphite pad 126/semiconductor die 120 to the joint surface between the semiconductor die 120 and sintered silver preform 104. As noted previously herein, the temperature required for bonding the lower surface of the semiconductor die 120 and the upper surface of the die-attach preform 104 may depend on the material of the die-attach preform 104. For example, in embodiments with a sintered silver preform 104, the controller 114 may cause the heating elements 108 to generate heat sufficient to raise the temperature of the sintered silver preform 104 to between 230° C. and 300° C. in order to bond the semiconductor die 120 to the sintered silver preform 104.

Following bonding of a die-attach preform 104 (e.g., sintered silver preform 104), the semiconductor die 120 may be coupled to a product substrate. A product substrate may include any product substrate configured to receive a semiconductor die 120 including, but not limited to, a ceramic substrate, a printed circuit board (PCB), an integrated circuit, a package body (e.g., quad flat no-lead (QFN) package), and the like. For example, the controller 114 may generate one or more control signals configured to cause the actuators 112 to actuate the handling tool 106 in order to bring a lower surface of the die-attach preform 104 coupled to the semiconductor die 120 into contact with an upper surface of a product substrate. The controller 114 may then generate one or more control signals configured to cause the one or more heating elements 108 to generate heat such that heat may be applied through the surface 124 of the handling tool 106, graphite pad 126, semiconductor die 120, and die-attach preform 104 to the joint surface between the die-attach preform 104 and a surface of the product substrate. In this regard, the heating elements 108 may be used to sinter the die-attach preform 104 coupled to a semiconductor die 120 in order to couple the semiconductor die 120 to the product substrate.

In embodiments, the use of the handling tool 106 for handling the various components of the present disclosure may provide for improved precision tooling, flexible size options, and fabrication of high-density product substrates. In particular, the use of a handling tool 106 actuatable via a controller 114 may enable die-attach preforms 104 and semiconductor die 120 to be fabricated and/or disposed adjacent to one another, thereby enabling further miniaturization of product substrates.

Embodiments of the present disclosure are directed to a novel die-attach material, process, and tooling approach for optimal thermal and RF performance of semiconductor die 120. As compared to conventional approaches, it is contemplated herein that the system 100 and method 200 of the present disclosure may enable significant improvements in automation speed and throughput, as well as improvements in performance, yield, component miniaturization, and overall cost.

It is noted herein that the one or more components of system 100 may be communicatively coupled to the various other components of system 100 in any manner known in the art. For example, the one or more processors 116 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth, 3G, 4G, 4G LTE, 5G and the like).

In one embodiment, the one or more processors 116 may include any one or more processing elements known in the art. In this sense, the one or more processors 116 may include any microprocessor-type device configured to execute software algorithms and/or instructions. In one embodiment, the one or more processors 116 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 116. In general, the term "processor" may be broadly defined to encompass any device having one or more processing elements, which execute program instructions from memory 118. Moreover, different subsystems of the system 100 (e.g., controller 114, actuators 112, planarization tools 122, handling tool 106) may include processor or logic elements suitable for carrying out at least a portion of the steps described throughout the present disclosure. Therefore, the above description should not be interpreted as a limitation on the present disclosure but merely an illustration.

The memory 118 may include any storage medium known in the art suitable for storing program instructions executable by the associated one or more processors 116. For example, the memory 118 may include a non-transitory memory medium. For instance, the memory 118 may include, but is not limited to, a read-only memory (ROM), a random-access memory (RAM), a magnetic or optical memory device (e.g., disk), a magnetic tape, a solid-state drive and the like. It is further noted that memory 118 may be housed in a common controller housing with the one or more processors 116. In an alternative embodiment, the memory 118 may be located remotely with respect to the physical location of the processors 116, controller 114, and the like. In another embodiment, the memory 118 maintains program instructions for causing the one or more processors 116 to carry out the various steps described through the present disclosure.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A method for fabricating semiconductor die with die-attach preforms, comprising:
    applying an uncured die-attach paste material to a surface of a forming substrate to form one or more die-attach preforms, the surface of the forming substrate formed from a hydrophobic material;
    curing the one or more die-attach preforms;
    performing one or more planarization processes on the one or more die-attach preforms, wherein the one or more planarization processes are performed by at least one of a precision lathe, a precision mill, or a diamond turning machining tool;
    coupling a first surface of a semiconductor die to a handling tool; and
    bonding a second surface of the semiconductor die to at least one die-attach preform of the one or more die-attach preforms.

2. The method of claim 1, wherein the one or more die-attach preforms comprise one or more sintered silver preforms.

3. The method of claim 1, wherein bonding the second surface of the semiconductor die to at least one die-attach preform comprises:
    applying heat to the at least one die-attach preform with one or more heating elements disposed within the handling tool.

4. The method of claim 1, further comprising:
    coupling the semiconductor die to a product substrate by bonding the die-attach preform to the product substrate.

5. The method of claim 4, wherein coupling the semiconductor die to a product substrate by bonding the die-attach preform to the product substrate comprises:
    applying heat to the at least one die-attach preform bonded to the second surface of the semiconductor die with one or more heating elements disposed within the handling tool.

6. The method of claim 1, wherein the at least one die-attach preform substantially conforms to a shape and size of the second surface of the semiconductor die.

7. The method of claim 1, wherein applying an uncured die-attach paste material to a forming substrate to form one or more die-attach preforms comprises:
    disposing a stencil on a forming substrate;
    applying an uncured die-attach paste material on top of the stencil; and
    removing the stencil to form one or more die-attach preforms.

8. The method of claim 1, wherein coupling the first surface of the semiconductor die to the handling tool comprises:
    applying a suction force through a vacuum port disposed in a surface of the handling tool with one or more vacuum sources; and
    coupling the first surface of the semiconductor die to the handling tool via the suction force.

9. A method for fabricating semiconductor die with die-attach preforms, comprising:
    applying an uncured die-attach paste material to a surface of a forming substrate to form one or more die-attach preforms, the surface of the forming substrate formed from a hydrophobic material;
    curing the one or more die-attach preforms;
    performing one or more planarization processes on the one or more die-attach preforms;
    coupling a first surface of a semiconductor die to a handling tool; and bonding a second surface of the semiconductor die to at least one die-attach preform of the one or more die-attach preforms, wherein applying an uncured die-attach paste material to a forming substrate to form one or more die-attach preforms comprises:
    disposing a stencil on a forming substrate;
    applying an uncured die-attach paste material on top of the stencil; and
    removing the stencil to form one or more die-attach preforms.

10. A method for fabricating semiconductor die with die-attach preforms, comprising:
    applying an uncured die-attach paste material to a surface of a forming substrate to form one or more die-attach preforms, the surface of the forming substrate formed from a hydrophobic material;
    curing the one or more die-attach preforms;
    performing one or more planarization processes on the one or more die-attach preforms;
    coupling a first surface of a semiconductor die to a handling tool; and bonding a second surface of the semiconductor die to at least one die-attach preform of the one or more die-attach preforms, wherein coupling the first surface of the semiconductor die to the handling tool comprises:

applying a suction force through a vacuum port disposed in a surface of the handling tool with one or more vacuum sources; and coupling the first surface of the semiconductor die to the handling tool via the suction force.

\* \* \* \* \*